(12) United States Patent
Chen et al.

(10) Patent No.: US 10,643,805 B2
(45) Date of Patent: May 5, 2020

(54) STARTING DEVICE

(71) Applicant: UNIFORM INDUSTRIAL CORP., New Taipei (TW)

(72) Inventors: Yu-Tsung Chen, New Taipei (TW); Chih-Hung Chen, New Taipei (TW); Shiang-Hau Huang, New Taipei (TW)

(73) Assignee: UNIFORM INDUSTRIAL CORP., New Taipei (TW)

( * ) Notice: Subject to any disclaimer, the term of this patent is extended or adjusted under 35 U.S.C. 154(b) by 123 days.

(21) Appl. No.: 16/105,145

(22) Filed: Aug. 20, 2018

(65) Prior Publication Data
US 2019/0348232 A1    Nov. 14, 2019

(30) Foreign Application Priority Data

May 9, 2018   (TW) .............................. 107206074 U

(51) Int. Cl.
| *H01H 13/14* | (2006.01) |
| *H01H 13/50* | (2006.01) |
| *H05K 7/14* | (2006.01) |
| *H01H 50/54* | (2006.01) |
| *H01H 50/64* | (2006.01) |
| *H01H 50/02* | (2006.01) |
| *H01H 3/28* | (2006.01) |
| *H01H 3/12* | (2006.01) |

(52) U.S. Cl.
CPC .............. *H01H 13/14* (2013.01); *H01H 3/12* (2013.01); *H01H 3/28* (2013.01); *H01H 13/50* (2013.01); *H01H 50/02* (2013.01); *H01H 50/54* (2013.01); *H01H 50/643* (2013.01); *H05K 7/1427* (2013.01)

(58) Field of Classification Search
CPC ........ H01H 13/14; H01H 13/50; H01H 50/02; H01H 50/54; H01H 50/643; H05K 7/1427

See application file for complete search history.

(56) References Cited

U.S. PATENT DOCUMENTS

| RE24,321 E | * | 5/1957 | Ray .......................... F16K 31/10 |
| | | | 251/129.03 |
| 3,072,769 A | * | 1/1963 | Roeser ................. H01H 13/506 |
| | | | 200/448 |

(Continued)

FOREIGN PATENT DOCUMENTS

| DE | 4128589 C1 * | 2/1993 | ............. H01H 13/50 |
| EP | 15228 A1 * | 9/1980 | |

*Primary Examiner* — Mohamad A Musleh
(74) *Attorney, Agent, or Firm* — Muncy, Geissler, Olds & Lowe, P.C.

(57) ABSTRACT

A starting device including a housing, a circuit board disposed in the housing, an electromagnetic element, a lever structure and a pressing assembly. A recessed hole is formed on one side of the housing. The circuit board is connected to a power cable. The electromagnetic element is electrically connected to the circuit board. The electromagnetic element includes a coil and a plunger operated by magnetic attraction of the coil. One end of the lever structure is in contact with the plunger. The pressing assembly includes a button cover and a screw rod disposed in the recessed hole. One end of the screw rod is fixedly connected to the button cover, while the other end of the screw rod extends out of the other side of the housing. The screw rod is screwably connected to the other end of the lever structure.

11 Claims, 9 Drawing Sheets

(56) References Cited

U.S. PATENT DOCUMENTS

| | | | | |
|---|---|---|---|---|
| 3,576,408 | A | * | 4/1971 | Meyerhoefer ........... H01H 9/06 200/52 R |
| 3,939,725 | A | * | 2/1976 | Fisher ..................... G05G 1/00 74/503 |
| 4,389,550 | A | * | 6/1983 | Reiter .................... H01H 13/68 200/330 |
| 5,675,303 | A | * | 10/1997 | Kelaita, Jr. .......... H01H 71/462 335/172 |
| 2006/0244557 | A1 | * | 11/2006 | Sorenson ............... H01H 71/68 335/172 |
| 2013/0146431 | A1 | * | 6/2013 | Smith ..................... H01H 3/26 200/331 |
| 2016/0133416 | A1 | * | 5/2016 | Pizzato ................ H01H 27/002 361/142 |

* cited by examiner

STARTING DEVICE

CROSS-REFERENCE TO RELATED APPLICATION

This non-provisional application claims priority under 35 U.S.C. § 119(a) to Patent Application No. 107206074 in Taiwan, R.O.C. on May 9, 2018, the entire contents of which are hereby incorporated by reference.

BACKGROUND

Technical Field

The instant disclosure generally relates to a starting device and, more particularly, to a starting device for a push switch.

Related Art

The modern technology brings forth convenience and enriches life through various electric appliances. Among them, for example, the switch button of a garage door, the switch button of an electric lamp, and the switch button of electronic or electrical appliances such as an audio system, a television or a computer are used to activate those appliances. With the development of smart homes, the intelligentization of conventional switch buttons becomes necessary.

A general switch device includes a battery, a DC motor, a gear set, and a pressing assembly inside a housing. One end of the pressing assembly extends out of the housing. The battery provides the DC motor with power to operate the DC motor to drive the speed gear set. The speed gear set drives the pressing assembly to stretch out or retract such that the pressing assembly presses a switch button to start or shut down various electric appliances.

A general switch device is pasted with a patch, which is adhered to the supporting surface (for example, a wall surface) to fix the position of the switch device. In order to adjust the distance between the pressing assembly and the switch button, multiple patches are added. A plurality of reusable sticky patches are used to increase the thickness, adjust the distance between the switch device and the supporting surface, and adjust the distance between the pressing assembly and the switch button so that the pressing height of the pressing assembly meets the distance to the switch button.

SUMMARY

In one embodiment of the instant disclosure, a starting device is provided, including: a housing, a circuit board, an electromagnetic element, a lever structure and a pressing assembly. The housing provides an accommodation room formed therein and a recessed hole formed on one side thereof. The recessed hole communicates with the accommodation room. The circuit board is disposed in the accommodation room and connected to a power cable. The electromagnetic element is disposed in the accommodation room and is electrically connected to the circuit board. The electromagnetic element includes a coil capable of receiving electrical energy to generate a magnetic force and a plunger operated by magnetic attraction of the coil. The lever structure is pivotedly connected to an inner wall surface of the accommodation room. One end of the lever structure is in contact with the plunger. The pressing assembly includes a button cover and a screw rod disposed in the recessed hole. One end of the screw is fixedly connected to the button cover, while the other end of the screw rod extends out of the other side of the housing. The screw rod is screwably connected to the other end of the lever structure. The screw rod rotates with the button cover at the other end of the lever structure to fine-tune the distance from the other end of the screw rod to the other side of the housing.

In one embodiment, the housing includes an upper case and a lower case combining with each other, the recessed hole is formed on a surface of the upper case, and the lower case includes an opening that the other end of the screw rod extends out.

In one embodiment, the lower case includes a plurality of side walls on an inner wall surface and a plurality of pivot holes formed on the plurality of side walls, and the lever structure includes on both sides a plurality of shafts pivotedly connected to the plurality of pivot holes.

In one embodiment, the distance from the shafts to the coil is larger than the distance from the shafts to the button cover.

In one embodiment, the pressing assembly includes a resilient element. One end of the resilient element is in contact with the button cover, while the other end of the resilient element is in contact with the other end of the lever structure.

In one embodiment, the button cover includes a limiting slot. The resilient element is disposed in the limiting slot and is socketedly connected to an outer portion of the screw rod.

In one embodiment, the lever structure provides a hollow slot at the other end, the pressing assembly includes a screw fastener disposed in the hollow slot, and the screw rod is disposed at the other end of the lever structure and is screwably connected to the screw fastener.

In one embodiment, the lever structure provides at the other end a location hole that the screw rod extends out of, a screw hole of the screw fastener aligns with the location hole and is locked to the screw rod, and male screw threads of the screw rod are screwably connected to female screw threads of the screw fastener.

In one embodiment, the lever structure includes at the other end a resilient body against the inner wall surface of the lower case.

In one embodiment, a plurality of embossed patterns is formed on an outer surface of the button cover, and the plurality of embossed patterns is exposed outside the recessed hole.

In one embodiment, the circuit board includes a connecting port exposed outside the housing to receive external signal cables.

Taking power supply into account, the use of a conventional external AC power supply as a power supply eliminates the problems associated with the use of a battery as a power supply. For example, an appliance with a battery-based power supply cannot operate if the battery has run out of electricity. Accordingly, the battery has to be replaced, which may be difficult for the user.

Considering the adjustment of the pressing height, the electromagnetic element drives the lever structure to drive the pressing assembly, which can simultaneously adjust the pressing distance, and overcome the problems caused by using the patch to adjust the pressing distance. For example, the durability and the adjustability of the pressing distance of the patch cannot compare to those of a rotary pressing assembly.

Considering manual convenience, the user can directly press the button cover to improve the convenience. In the absence of electricity, direct pressing provides operation convenience.

BRIEF DESCRIPTION OF THE DRAWINGS

This disclosure will become more fully understood from the detailed description given herein below for illustration only, and thus not limitative of this disclosure, wherein.

DETAILED DESCRIPTION

Detailed description of the characteristics and the advantages of the instant disclosure are shown in the following embodiments. The technical content and the implementation of the instant disclosure should be readily apparent to any person skilled in the art from the detailed description, and the purposes and the advantages of the instant disclosure should be readily understood by any person skilled in the art with reference to content, claims, and drawings in the instant disclosure.

Figure 1:
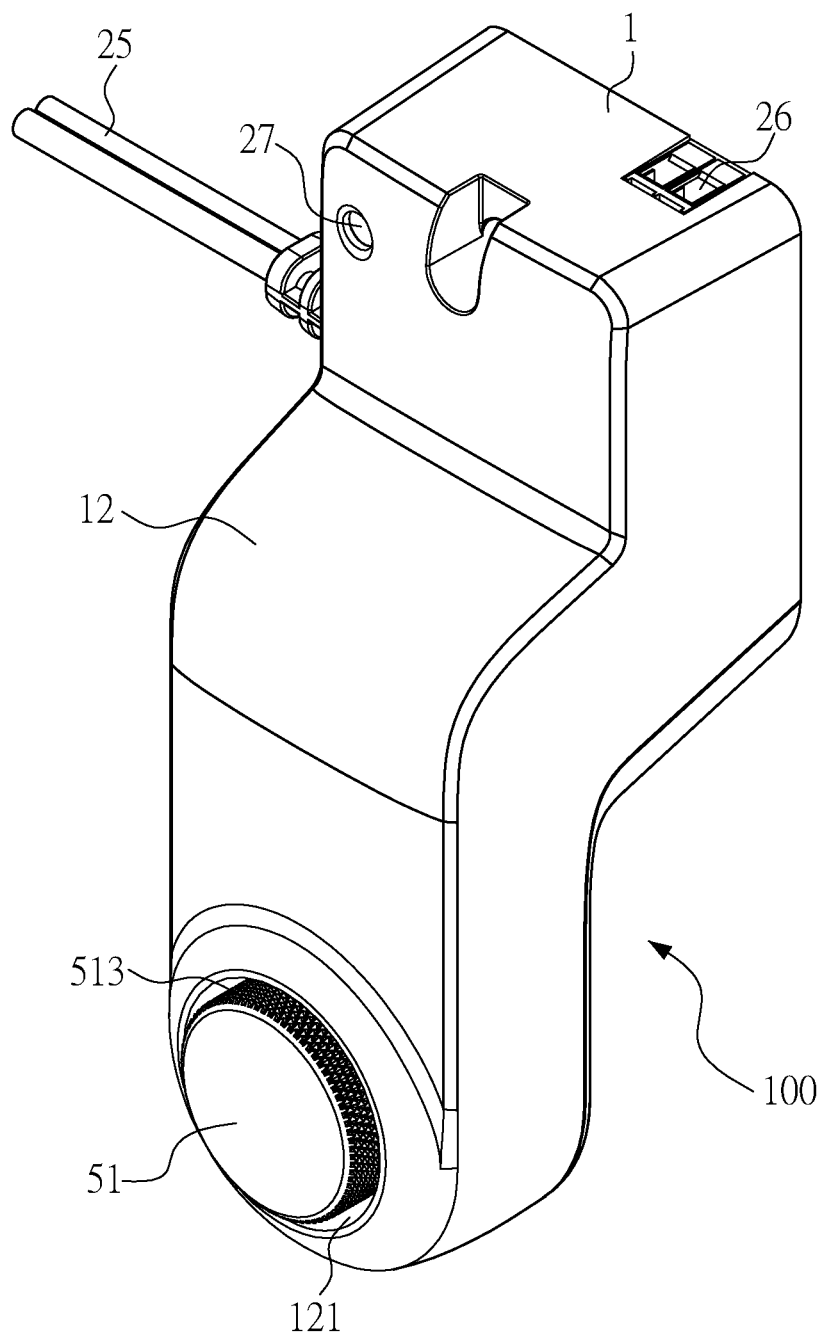
FIG. 1 is a front view of a starting device according to one embodiment of the instant disclosure.
Figure 2:
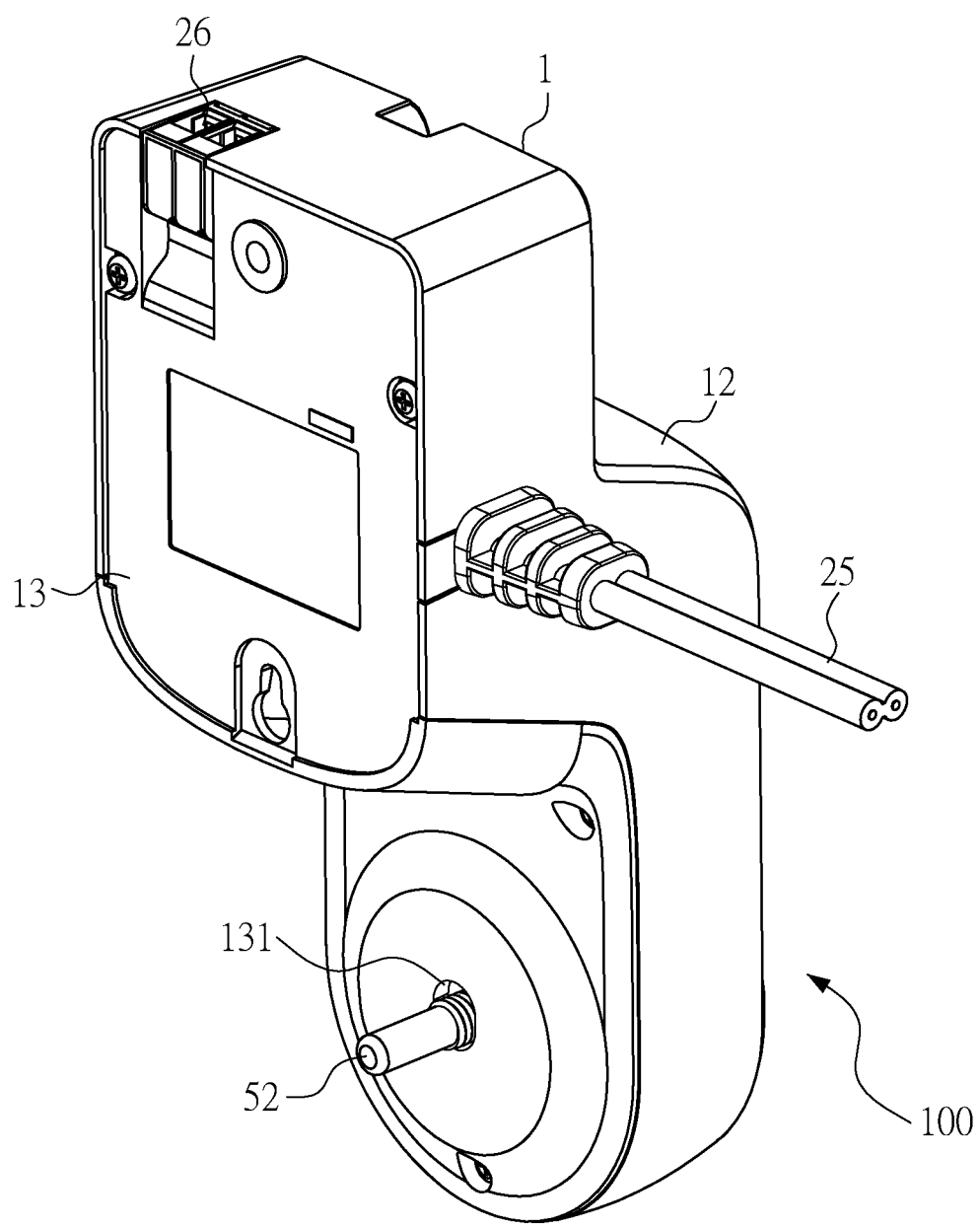
FIG. 2 is a rear view of a starting device according to one embodiment of the instant disclosure.

Referring to both FIG. 1 and FIG. 2, FIG. 1 is a front view of a starting device and FIG. 2 is a rear view of a starting device according to one embodiment of the instant disclosure. In this embodiment, the starting device 100 can be installed in the surrounding of a switch button (an ON/OFF switch button, which can be a multi-section switch or a single-section switch) of various electric appliances, or in the surrounding of a gate (for example, a food outlet gate of a cat food box) of a non-electric device. The switch button can control ON or OFF of electric appliances such as a garage door, a lamp, an audio system, a televisions or a computer.

The switch buttons of various electric appliances may be push switches, tactile switches, or rocker switches.

The switch button is triggered by the screw rod 52 of the starting device 100 to start the operation of various electric appliances, or the screw rod 52 of the starting device 100 is used to open the gate of non-electric devices to drop the articles from the opening of the gate.

Figure 3:
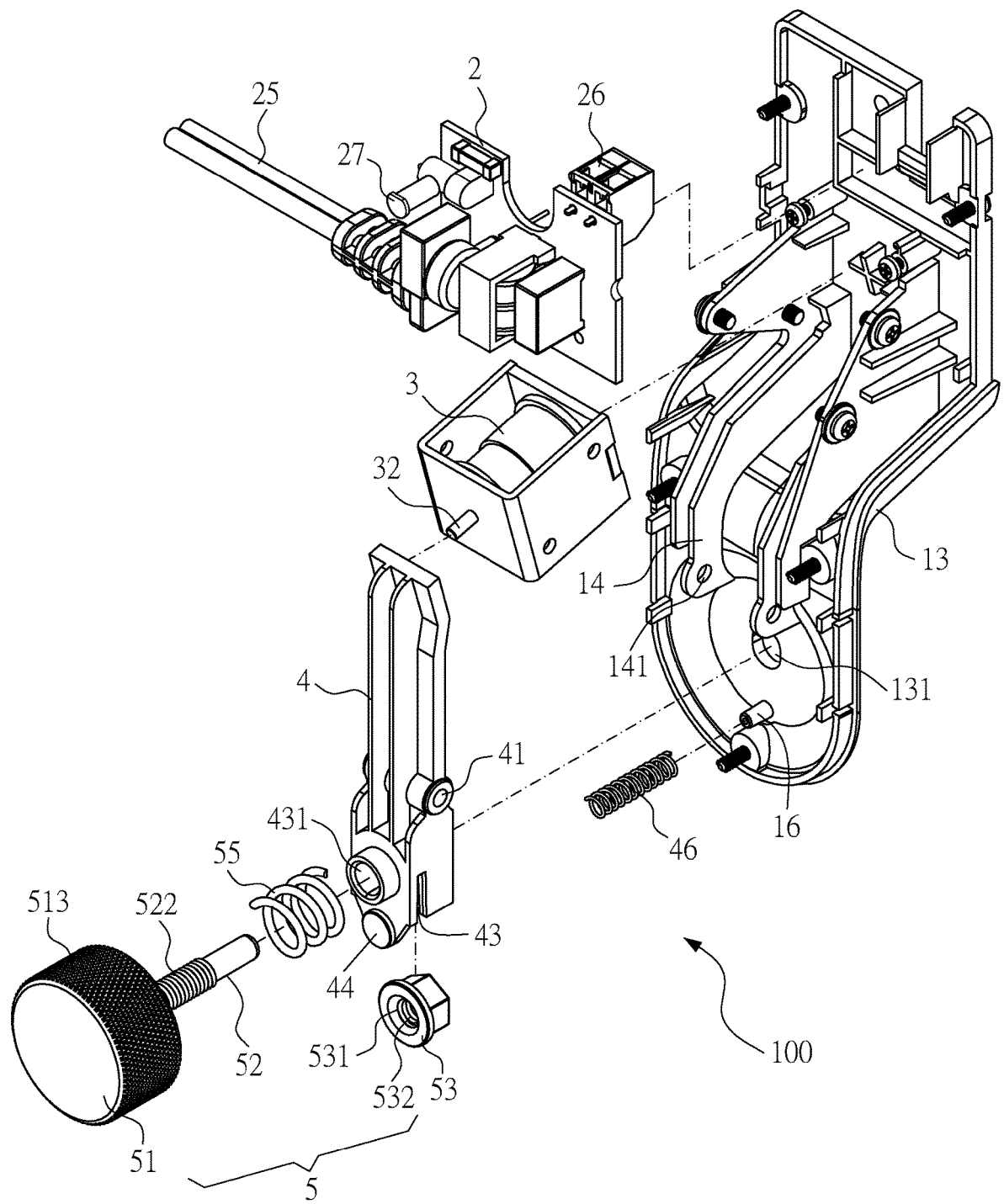
FIG. 3 is a front exploded view of a starting device according to one embodiment of the instant disclosure.
Figure 4:
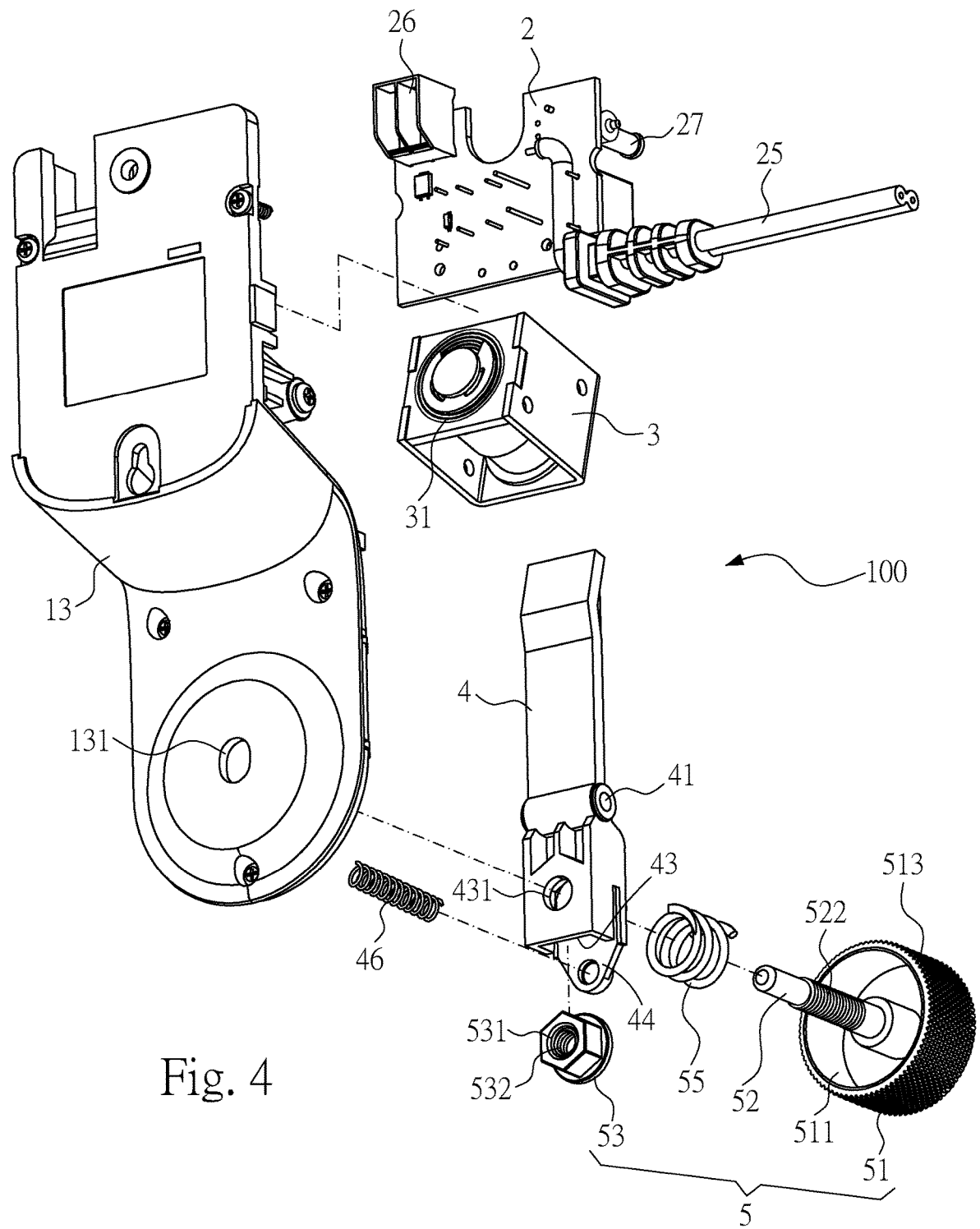
FIG. 4 is a rear exploded view of a starting device according to one embodiment of the instant disclosure.

Referring to FIG. 1 to FIG. 3, FIG. 3 is a front exploded view of a starting device. In this embodiment, the starting device 100 includes a housing 1, a circuit board 2, an electromagnetic element 3, a lever structure 4 and a pressing assembly 5.

Figure 5:
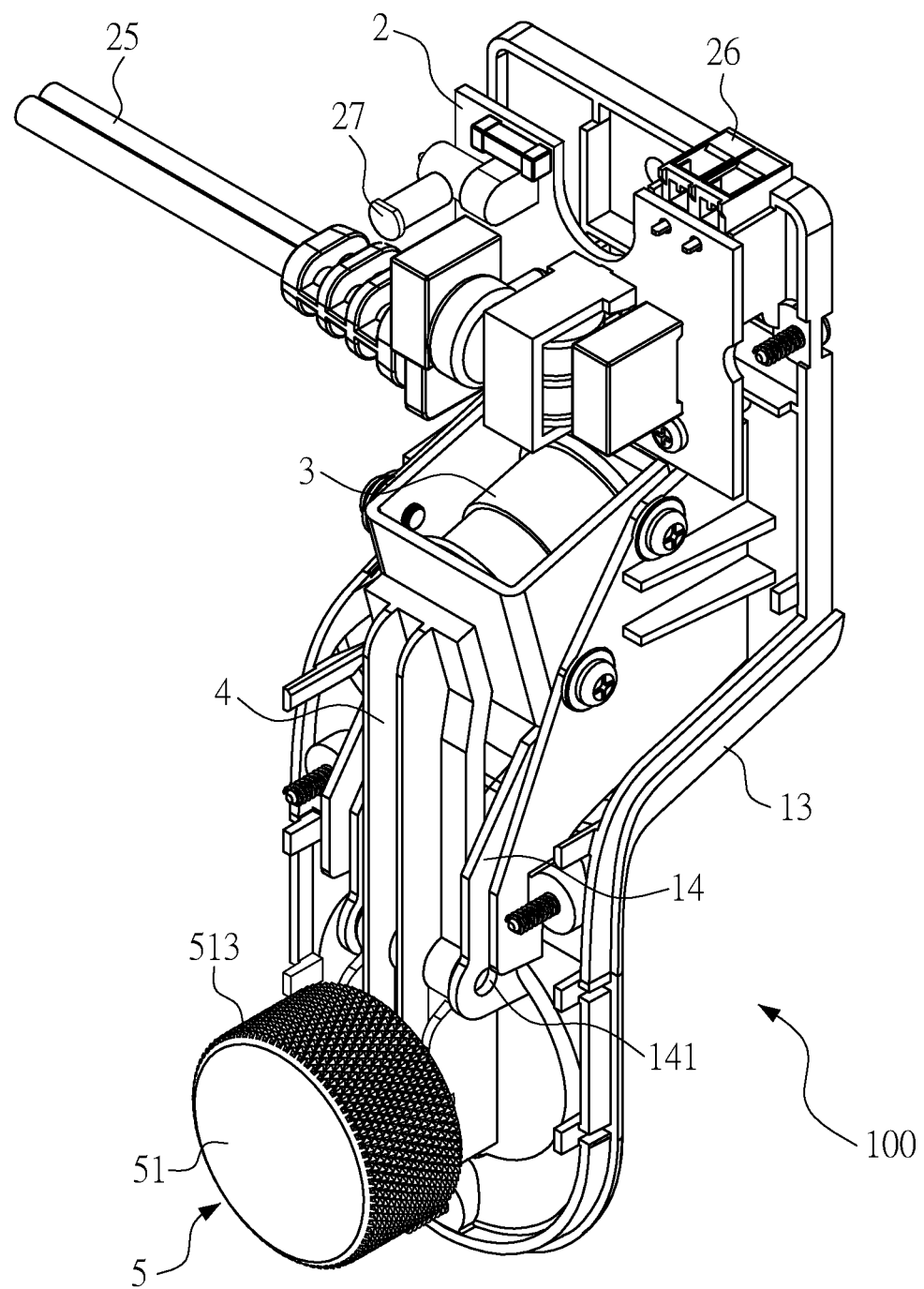
FIG. 5 is a front local view of a starting device according to one embodiment of the instant disclosure.
Figure 6:
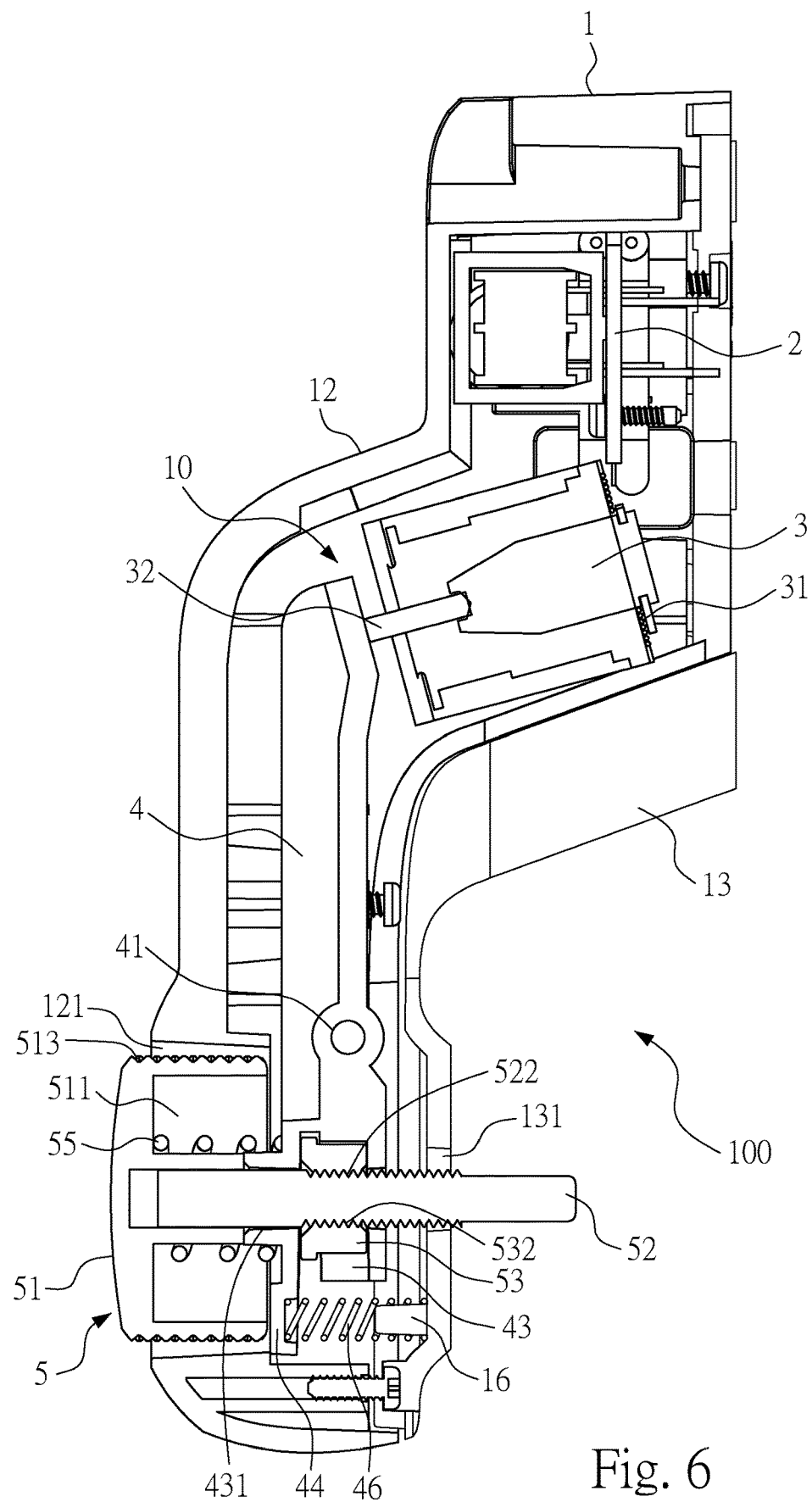
FIG. 6 is a side view of a starting device according to one embodiment of the instant disclosure.
Figure 7:
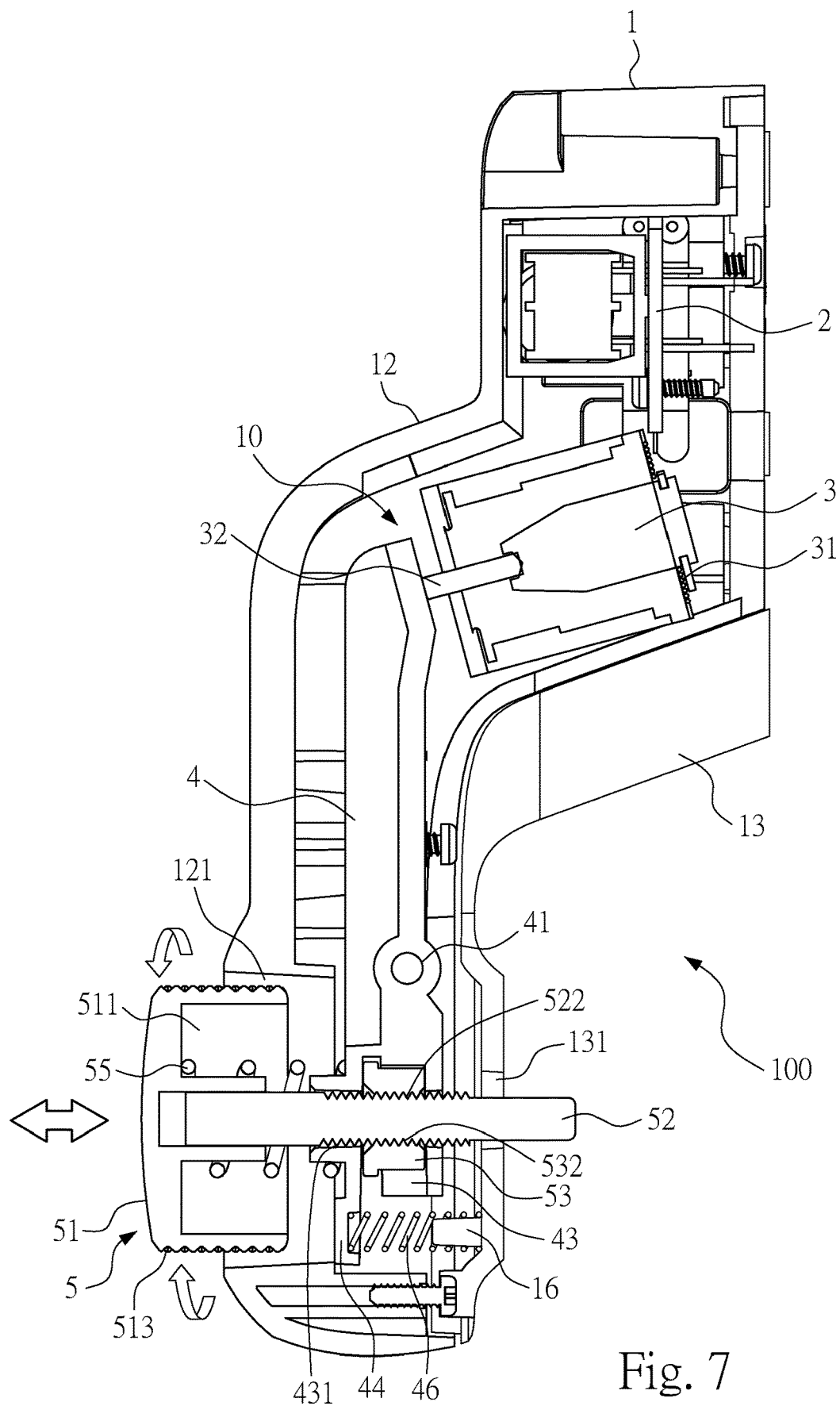
FIG. 7 is a side view of a starting device under manual operation according to one embodiment of the instant disclosure.

Referring to FIG. 3 to FIG. 6, FIG. 4 is a rear exploded view, FIG. 5 is a front local view, and FIG. 6 is a side view of a starting device. In this embodiment, the housing 1 is a multi-piece structure. In some embodiments, however, the housing 1 may be a single member. Here, the housing 1, as a whole, forms a panel portion that can be manually operated, a fixing portion that can be fixed on the supporting surface, an extension portion between the panel portion and the fixing portion. The panel portion and the fixing portion are located on different horizontal lines by the inclined extension portion such that a proper distance is maintained between the panel portion and the switch button.

The so-called supporting surface may be a wall in the surrounding of a switch button of a garage gate, or a housing in the surrounding of a switch button of various electronic and electric appliances such as an electric light, an audio system, a television, or a computer.

Referring to FIG. 3 to FIG. 6, in this embodiment, the housing 1 is provided with an accommodation room 10 therein and a recessed hole 121 formed on one side thereof. The recessed hole 121 communicates with the accommodation room 10. The recessed hole 121 is formed on the panel portion of the housing 1.

Referring to FIG. 3 to FIG. 6, in this embodiment, the circuit board 2 is provided with various electronic circuit components (such as processing chips, transformers, resistors or capacitors, etc.) The circuit board 2 is disposed in the accommodation room 10 and is connected to a power cable 25. The circuit board 2 is connected to the utility through the power cable 25 to provide the starting device 100 with AC power.

Referring to FIG. 3 to FIG. 6, in this embodiment, the electromagnetic element 3 is a solenoid or an electromagnet. The electromagnetic element 3 is disposed in the accommodation room 10 and is electrically connected to the circuit board 2. The electromagnetic element 3 includes a coil receiving electrical energy to generate a magnetic force 31 and a plunger 32 (for example, movable iron) operated by magnetic attraction of the coil 31. The electric energy generates a magnetic force through the coil 31 to attract the movable iron to move back and forth. The movement of the movable iron is caused by powering on or off the coil 31.

Figure 8:
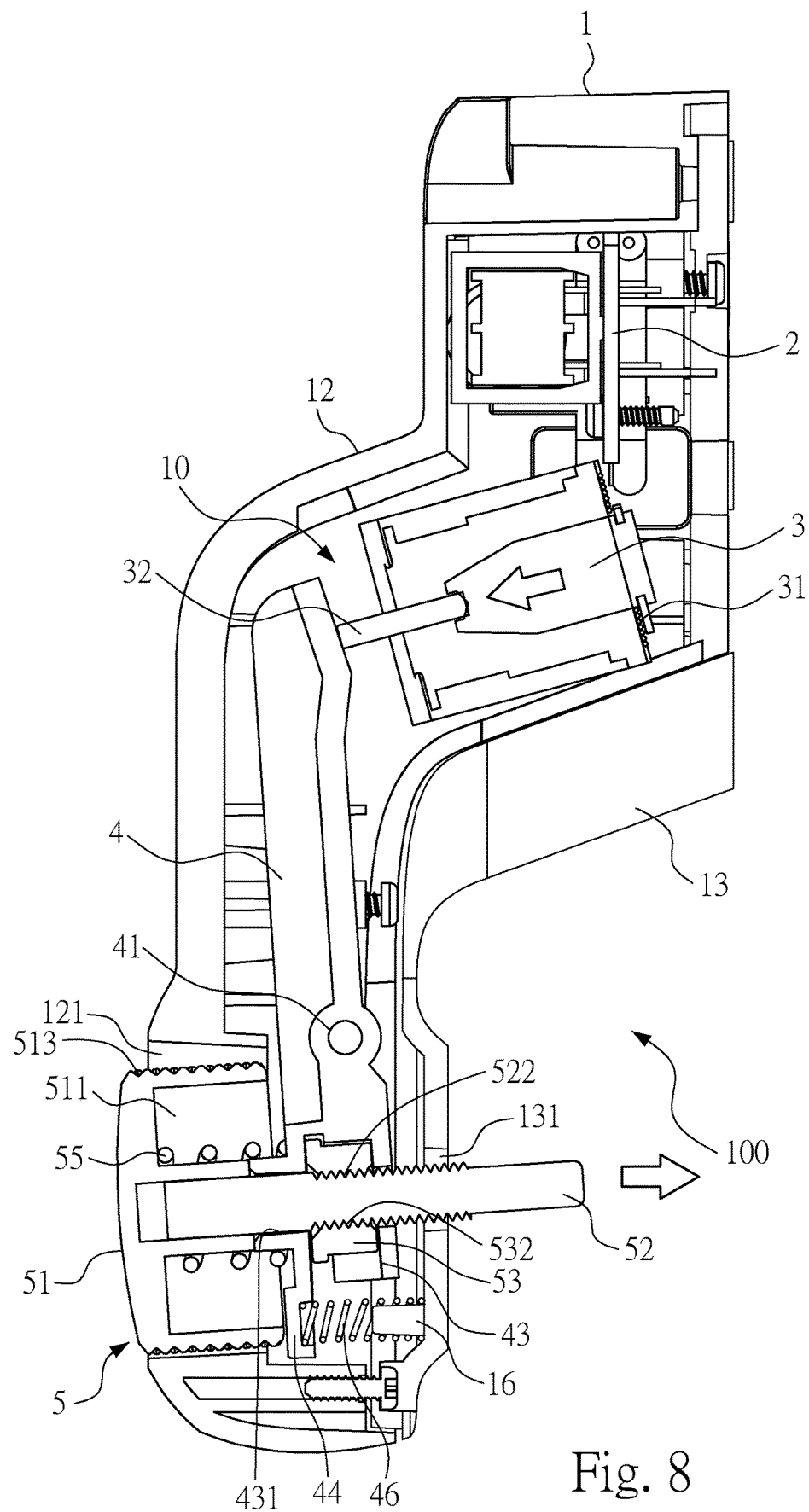
FIG. 8 is a side view of a starting device under electric operation according to one embodiment of the instant disclosure.
Figure 9:
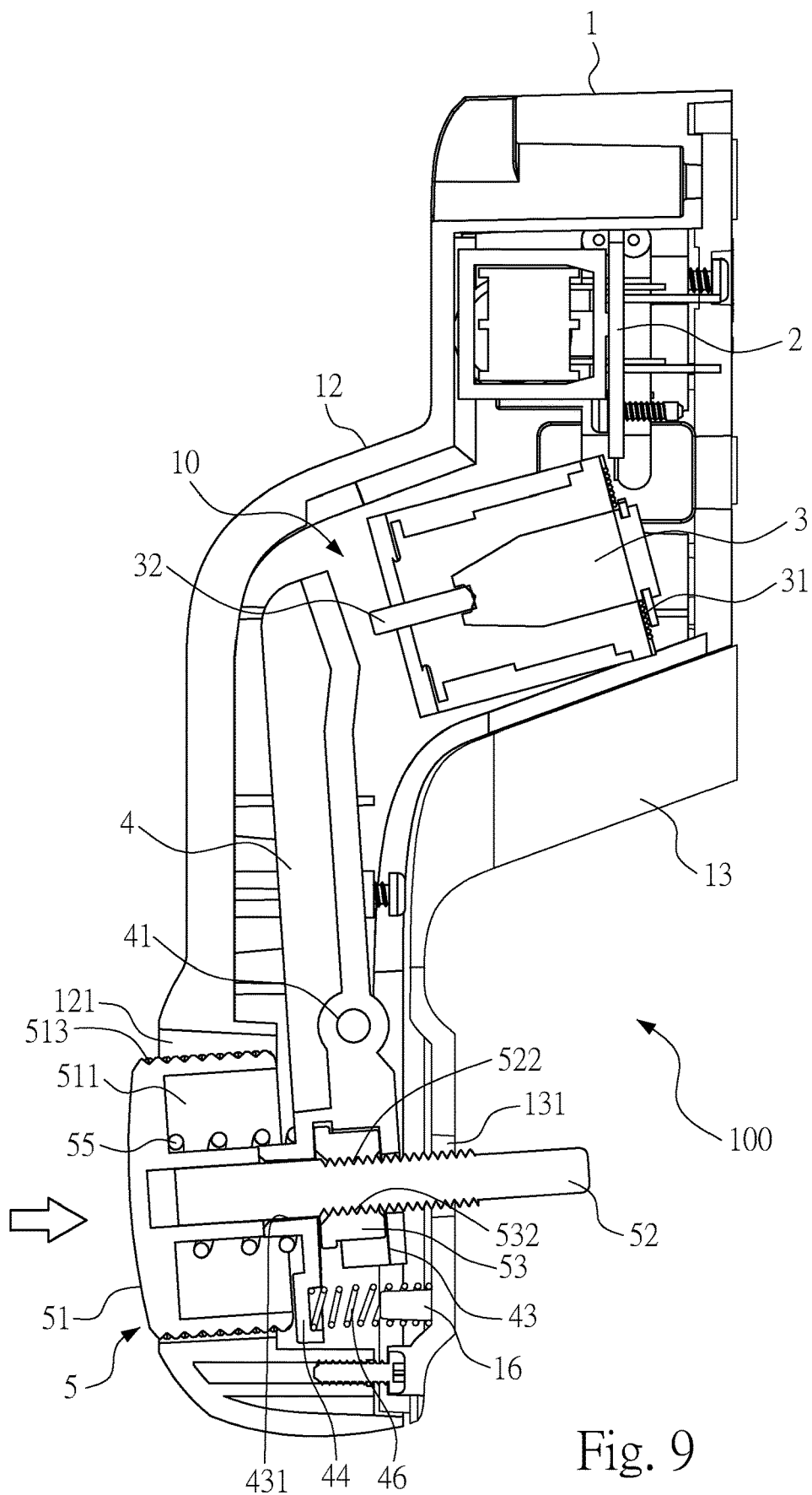
FIG. 9 is a side view of a starting device under manual operation according to one embodiment of the instant disclosure.

Referring to FIG. 3 to FIG. 6, in this embodiment, the lever structure 4 is an elongated plate. The lever structure 4 is pivotedly connected to an inner wall surface of the accommodation room 10. One end of the lever structure 4 is in contact with the plunger 32 of the electromagnetic element 3. Based on the characteristics of the lever structure 4, the pivot structure of the lever structure 4 is a rotational center. Referring to FIG. 8, when one end of the lever structure 4 is pushed by the plunger 32 of the electromagnetic element 3 toward a first direction (swinging to the left), the other end of the lever structure 4 moves toward a second direction (swinging to the right). The second direction is opposite to the first direction.

Referring to FIG. 3 to FIG. 6, in this embodiment, the distance from the shaft 41 to the coil 31 is larger than the distance from the shaft 41 to the button cover 51. In other words, the distance from the pivot structure (as a fulcrum) of the lever structure 4 to the coil 31 (as a force point) is larger than the distance from the pivot structure (as a fulcrum) of the lever structure 4 to the button cover 51 (as a load point). One end of the lever structure 4 (force point) is driven by the plunger 32 such that the force point is far from the fulcrum and the load point is near the fulcrum. The farther the force point is from the fulcrum, the less laborious it becomes.

Referring to FIG. 3 to FIG. 6, in this embodiment, the pressing assembly 5 includes a button cover 51 and a screw rod 52 disposed in the recessed hole 121. The button cover 51 is a round button. The surface and a part of the side ring surface of the button cover 51 are exposed outside the recessed hole 121. One end of the screw rod 52 is fixedly connected to the button cover 51. The other end of the screw rod 52 extends out of the other side of the housing 1 to be in contact with the switch button of general electronic and/or electric appliances. The screw rod 52 is screwably connected to the other end of the lever structure 4.

In some embodiments, the starting device 100 can be assembled with a collar or a hook at the other end on the screw rod 52 such that an accessory such as a collar or a hook can be combined with a lever of a slide switch to control ON or OFF.

Referring to FIG. 3, FIG. 4, FIG. 6 and FIG. 7, FIG. 7 is a side view of a starting device under manual operation. In this embodiment, the button cover 51 is manually driven to rotate with the screw rod 52. The screw rod 52 rotates at the other end of the lever structure 4 to fine-tune the distance from the other end of the screw rod 52 to the other side of the housing 1. The screw rod 52 moves in a spiral manner to achieve a stepless fine movement.

Referring to FIG. 3, FIG. 4, FIG. 6 and FIG. 7, in this embodiment, a screw fastener 53 is added at the other end of the lever structure 4, and a screw hole 531 of the screw fastener 53 is screwably connected to the screw rod 52, to which, however, the instant disclosure is not limited. In some embodiments, the screw hole may be directly arranged on the lever structure 4 such that the screw rod 52 is screwably connected to the screw rod 52. In other words, the screw rod 52 rotationally moves at the other end of the lever structure 4. The screw hole may be directly provided at the other end of the lever structure 4. The screw rod 52 is directly and screwably connected to the screw hole at the other end of the lever structure 4 to rotationally move.

The so-called fine adjustment is because the male screw threads 522 of the screw rod 52 and the female screw threads 532 of the screw hole 531 are screwably connected to each other. The effect of fine-tuning is provided by the characteristics of the rotational movement of the threads to steplessly and delicately move the screw rod 52 by an axial displacement.

The so-called moving distance is the adjustable distance from the other end of the screw rod 52 to the other side of the housing 1. In other words, the moving distance is the adjustable distance between the other end of the screw rod 52 and the switch button. Here, the moving distance causes the axial displacement of the screw rod 52 because of the characteristics of the rotational movement of the threads. The screw rod 52 is generally horizontal as viewed from the side.

The adjustability of the moving distance allows the user to adjust the distance between the other end of the screw rod 52 and the switch button that the screw rod 52 and the switch button can be in contact during pressing, or adjust the distance that the other end of the screw rod 52 is directly in contact with the surface of the switch button, or adjust the distance between the other end of the screw rod 52 and the surface of the switch button to remain. The height of the switch button can be adjusted accordingly.

Referring to FIG. 3, FIG. 4, FIG. 6 and FIG. 8, FIG. 8 is a side view of a starting device under electric operation. In this embodiment, when electricity is applied to the electromagnetic element 3, the plunger 32 is elongated by magnetic attraction of the coil 31 such that one end of the plunger 32 pushes the lever structure 4 to operate, the lever structure 4 drives the pressing assembly 5 to move, and the screw rod 52 presses the switch button to start the electric appliances. When the screw rod 52 is electrically driven to move, one end of the lever structure 4 is driven by the plunger 32 of the electromagnetic element 3. The other end of the lever structure 4 is swung to cause the inclined movement of the screw rod 52. The screw rod 52 is generally inclined as viewed from the side.

Referring to FIG. 3, FIG. 4, FIG. 6 and FIG. 9, FIG. 9 is a side view of a starting device under manual operation. In this embodiment, the button cover 51 can be directly pressed such that the button cover 51 and the screw rod 52 move toward the switch button and that the screw rod 52 presses the switch button to start the electric appliances. For example, in the case that no power is available or that direct operation on the switch is required, functions that facilitate directly pressing the button cover 51 and triggering the switch button are provided. When the button cover 51 is manually pressed, the other end of the lever structure 4 is swung to cause the inclined movement of the screw rod 52. The screw rod 52 is generally inclined as viewed from the side.

Referring to FIG. 3 to FIG. 6, in this embodiment, the housing 1 includes an upper case 12 and a lower case 13 combining with each other. The recessed hole 121 is formed on a surface of the upper case 12. The lower case 13 includes an opening 131 that the other end of the screw rod 52 extends out. The lower case 13 includes a cylinder 16 adjacent to the surrounding of the opening 131. The cylinder 16 is provided with a resilient body 46 jacketing the same.

Referring to FIG. 3 to FIG. 6, in this embodiment, the lower case 13 includes a plurality of side walls 14 on an inner wall surface and a plurality of pivot holes 141 formed on the plurality of side walls 14. The lever structure 4 includes on both sides a plurality of shafts 41 pivotedly connected to the plurality of pivot holes 141.

Referring to FIG. 3 to FIG. 6, in this embodiment, the pressing assembly 5 includes a resilient element 55. One end of the resilient element 55 is in contact with the button cover 51, while the other end of the resilient element 55 is in contact with the other end of the lever structure 4. The resilient element 55 stands against the button cover 51, the rotation of the button cover 51 results in resistance due to the friction between the reliable element 55 and the button cover 51 to avoid excessive rotation of the button cover 51.

Referring to FIG. 3 to FIG. 6, in this embodiment, the button cover 51 includes a limiting slot 511 on the side. The resilient element 55 may be a compressed spring. The resilient element 55 may be disposed in the limiting slot 511 and socketedly connected to an outer portion of the screw rod 52. The resilient element 55 may be compressed or rebounded in the limiting slot 511 to avoid falling off.

Referring to FIG. 3 to FIG. 6, in this embodiment, the lever structure 4 provides a hollow slot 43 at the other end. The pressing assembly 5 includes a screw fastener 53 disposed in the hollow slot 43. The screw rod 52 is disposed at the other end of the lever structure 4 and is screwably connected to the screw fastener 53. Here, the screw fastener 53 is placed in the hollow slot 43 to form a limit. When the screw fastener 53 and the screw rod 52 are screwably connected to each other, the screw fastener 53 is fixed and does not rotate.

Referring to FIG. 3 to FIG. 6, in this embodiment, the lever structure 4 provides at the other end a location hole 431 that the screw rod 52 extends out. A screw hole 531 of the screw fastener 53 aligns with the location hole 431 and is locked to the screw rod 52. Male screw threads 522 of the screw rod 52 are screwably connected to female screw threads 532 of the screw fastener 52. Here, the lever structure 4 is a plastic member. The screw fastener 53 has a metal nut structure. The screw rod 52 uses a metal material. The screw rod 52 and the screw fastener 53, both made of metal, are screwably connected to each other to ensure the durability of use.

Referring to FIG. 3 to FIG. 6, in this embodiment, the lever structure 4 includes at the other end a resilient body 46 against the inner wall surface of the lower case 13. The resilient body 46 is a compressed spring or an elastic rubber such that the lever structure 4 and the button cover 51 can return to their initial positions when the button cover 51 is manually released or the coil 31 stops providing the magnetic force. Here, in order to increase the limit of the resilient body 46, the cylinder 16 is protruded on the inner wall surface of the lower case 13. One end of the resilient body 46 is socketedly connected to the cylinder 16. The other end of the lever structure 4 extends with a baffle 44. The baffle 44 is provided with a hollow slot in a side recess. The other end of the resilient body 46 is positioned in the hollow slot.

Referring to FIG. 3 to FIG. 6, in this embodiment, a plurality of embossed patterns 513 are formed on an outer surface of the button cover 51. Here, the embossed patterns 513 are formed on a side ring surface of the round button. The embossed patterns 513 are exposed outside the recessed hole 121 such that a user's hand can be in direct contact with the embossed patterns 513 to provide friction, facilitating the rotation of the button cover 51.

Referring to FIG. 3 to FIG. 6, in this embodiment, the circuit board 2 includes a connecting port 26 exposed outside the housing 1 to receive external signal cables. The connecting port 26 includes a plurality of jacks capable of receiving one end of the signal cables to receive two control signals. After the connecting port 26 receives a message instruction from the externally signal cables, the starting device 100 is activated. In addition, each signal cable connects to a wireless transceiver at the other end to wirelessly transmit and receive the control signals sent by a mobile device. When the mobile device of a user transmits a control signal, the control signal is transmitted to the starting device 100 via the signal cables of the wireless transceiver to apply electricity to the electromagnetic element 3. The plunger 32 is elongated by magnetic attraction of the coil 31 such that one end of the plunger 32 pushes the lever structure 4 to swing and drive the pressing assembly 5 to move and that the screw rod 52 presses the switch button to start the electric appliances.

Referring to FIG. 1, FIG. 3 to FIG. 5, in this embodiment, the circuit board 2 includes an indicator light 27 exposed outside the housing 1 for displaying the usage state and the abnormal state of the starting device 100. The indicator light 27 can display identical or different colors with persistent or intermittent light.

Taking power supply into account, the use of a conventional external AC power supply as a power supply eliminates the problems associated with the use of a battery as a power supply. For example, an appliance with a battery-based power supply cannot operate if the battery has run out of electricity. Accordingly, the battery has to be replaced, which may be difficult for the user.

Considering the adjustment of the pressing height, the electromagnetic element drives the lever structure to drive the pressing assembly, which can simultaneously adjust the pressing distance, and overcome the problems caused by using the patch to adjust the pressing distance. For example, the durability and the adjustability of the pressing distance of the patch cannot compare to those of a rotary pressing assembly.

Considering manual convenience, the user can directly press the button cover to improve the convenience. In the absence of electricity, direct pressing provides operation convenience.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation to encompass all such modifications and similar structures.

What is claimed is:

1. A starting device, comprising:
   a housing with an accommodation room formed therein and a recessed hole formed on one side thereof, said recessed hole communicating with said accommodation room;
   a circuit board disposed in said accommodation room and connected to a power cable;
   an electromagnetic element disposed in said accommodation room and electrically connected to said circuit board, said electromagnetic element comprising a coil capable of receiving electrical energy to generate a magnetic force and a plunger operated by magnetic attraction of said coil;
   a lever structure pivotedly connected to an inner wall surface of said accommodation room, one end of said lever structure being in contact with said plunger; and
   a pressing assembly comprising a button cover and a screw rod disposed in said recessed hole, one end of said screw being fixedly connected to said button cover, the other end of said screw rod extending out of the other side of said housing, said screw rod being screwably connected to the other end of said lever structure, wherein said screw rod rotates with said button cover at said the other end of said lever structure to fine-tune the distance from said the other end of said screw rod to said the other side of said housing.

2. The starting device according to claim 1, wherein said housing comprises an upper case and a lower case combining with each other, said recessed hole is formed on a surface of said upper case, and said lower case comprises an opening that said the other end of said screw rod extends out of.

3. The starting device according to claim 2, wherein said lower case comprises a plurality of side walls on an inner wall surface and a plurality of pivot holes formed on said plurality of side walls, and said lever structure comprises on both sides a plurality of shafts pivotedly connected to said plurality of pivot holes.

4. The starting device according to claim 3, wherein the distance from said shafts to said coil is larger than the distance from said shafts to said button cover.

5. The starting device according to claim 3, wherein said pressing assembly comprises a resilient element, one end of said resilient element being in contact with said button cover, while the other end of said resilient element being in contact with said the other end of said lever structure.

6. The starting device according to claim 5, wherein said button cover comprises a limiting slot, said resilient element being disposed in said limiting slot and socketedly connected to an outer portion of said screw rod.

7. The starting device according to claim 5, wherein said lever structure provides a hollow slot at said the other end, said pressing assembly comprises a screw fastener disposed in said hollow slot, and said screw rod is disposed at said the other end of said lever structure and screwably connected to said screw fastener.

8. The starting device according to claim 7, wherein said lever structure provides at said the other end a location hole that said screw rod extends out of, a screw hole of said screw fastener aligns with said location hole and is locked to said screw rod, and male screw threads of said screw rod are screwably connected to female screw threads of said screw fastener.

9. The starting device according to claim 2, wherein said lever structure comprises at said the other end a resilient body against said inner wall surface of said lower case.

10. The starting device according to claim 1, wherein a plurality of embossed patterns are formed on an outer surface of said button cover, and said plurality of embossed patterns are exposed outside said recessed hole.

11. The starting device according to claim 1, wherein said circuit board comprises a connecting port exposed outside said housing to receive external signal cables.

\* \* \* \* \*